United States Patent
Nagata (10) Patent No.: US 7,772,864 B2
(45) Date of Patent: Aug. 10, 2010

(54) CONTACT PROBE WITH REDUCED VOLTAGE DROP AND HEAT GENERATION

(75) Inventor: Takahiro Nagata, Gunma (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 11/889,912

(22) Filed: Aug. 17, 2007

(65) Prior Publication Data
US 2008/0048702 A1    Feb. 28, 2008

(30) Foreign Application Priority Data
Aug. 18, 2006   (JP)   ............................. 2006-223124

(51) Int. Cl.
*G01R 1/067*   (2006.01)
(52) U.S. Cl. ...................... 324/761; 324/754
(58) Field of Classification Search .................. None
See application file for complete search history.

(56) References Cited
U.S. PATENT DOCUMENTS
4,701,702 A * 10/1987 Kruger ........................ 324/761
4,773,877 A * 9/1988 Kruger et al. ................ 439/482
4,931,726 A * 6/1990 Kasukabe et al. ........... 324/754

FOREIGN PATENT DOCUMENTS
JP    2006-098254    4/2006
JP    2006-223124    4/2006

* cited by examiner

*Primary Examiner*—Vinh P Nguyen
(74) *Attorney, Agent, or Firm*—Morgan, Lewis & Bockius LLP (57) ABSTRACT

A contact probe includes a plurality of probes, each of the probes including: an conductive tube; an conductive plunger, contained in at least one end side of the tube, and having a distal end part protruding outward from the tube in an axial direction of the tube; and a coil spring, contained in the tube, and adapted to elastically urge the plunger outward. The plural probes are arranged in a first direction in a socket comprised of insulating material. A cross section of the tube in a direction perpendicular to the axial direction of the tube has a greater size in a direction different from the first direction than a size in the first direction.

2 Claims, 10 Drawing Sheets

CONTACT PROBE WITH REDUCED VOLTAGE DROP AND HEAT GENERATION

BACKGROUND OF THE INVENTION

The present invention relates to a contact probe to which a large electric current can be supplied.

Figure 15:
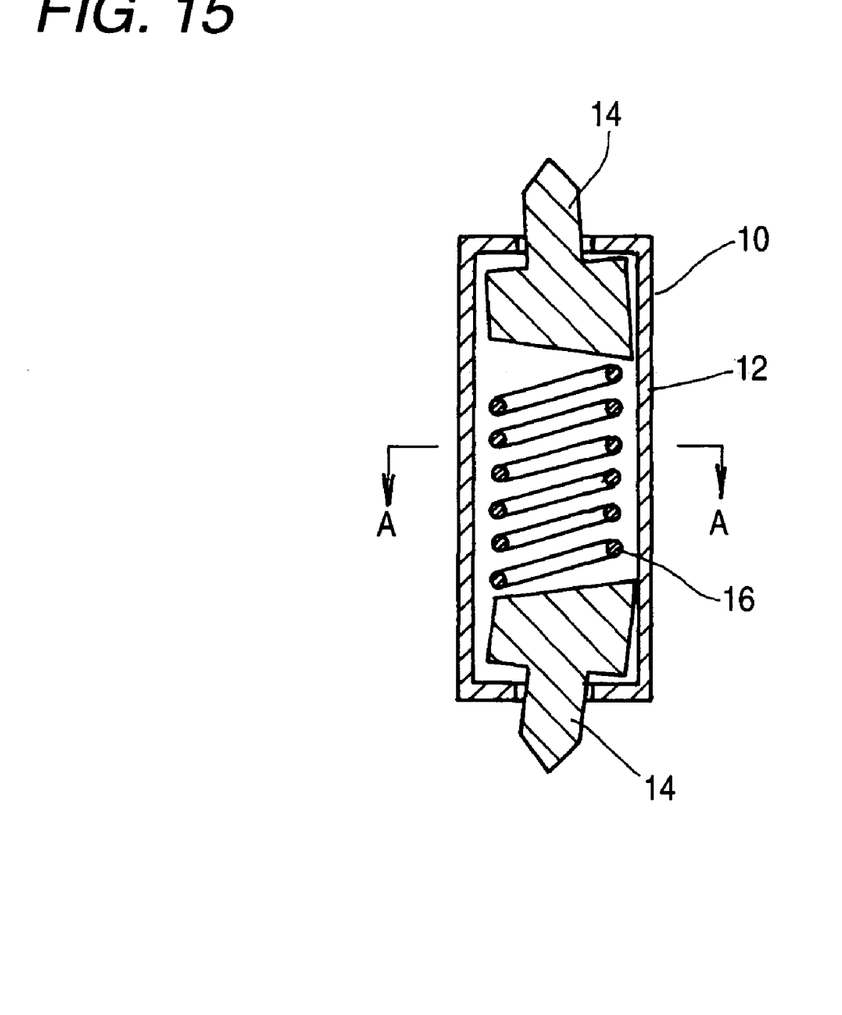
FIG. 15 is a vertical sectional view of a probe in the related art.
Figure 16:
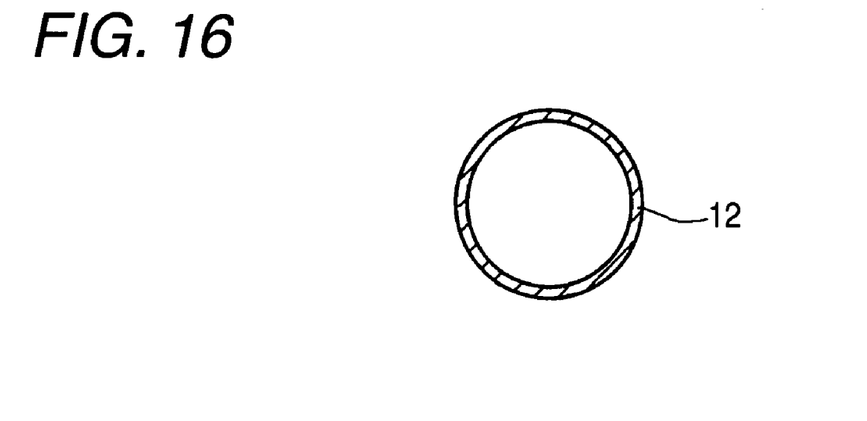
FIG. 16 is a sectional view of a tube in FIG. 15 as seen in a direction of arrow marks A-A.
Figure 17:
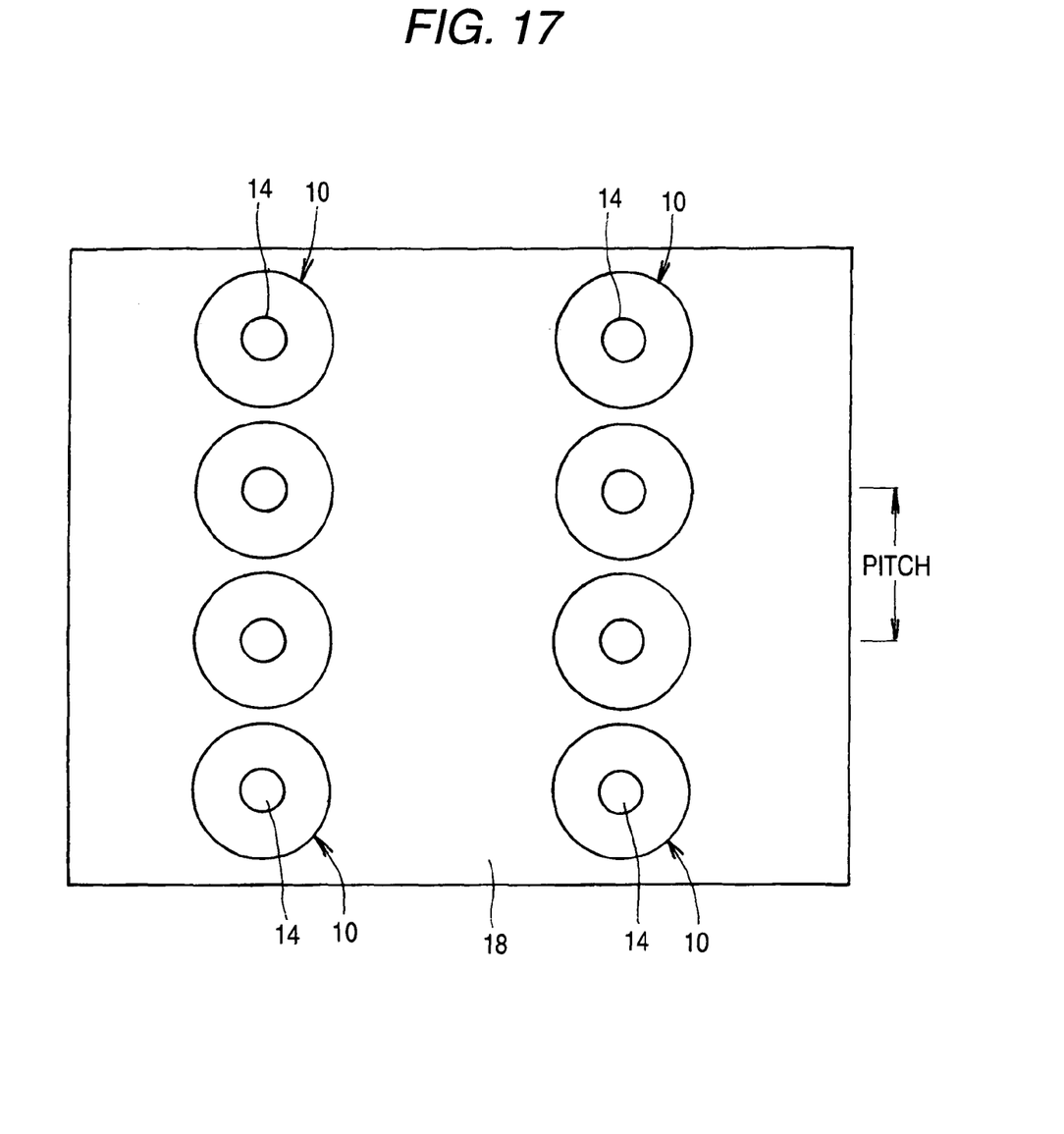
FIG. 17 is a plan view showing a plurality of the probes as shown in FIG. 15 provided in a socket.

An example of a probe in the related art will be described referring to FIGS. 15 to 17. FIG. 15 is a vertical sectional view of the probe in the related art. FIG. 16 is a sectional view of a tube in FIG. 15 as seen in a direction of arrow marks A-A. FIG. 17 is a plan view showing a plurality of the probes as shown in FIG. 15 provided in a socket. In FIGS. 15 to 17, a probe 10 includes a tube 12 in a cylindrical shape having a relatively thin wall thickness and formed of electrically conductive metal, and plungers 14, 14 formed of electrically conductive metal which are contained in the tube 12 so as to be protruded and contracted in an axial direction so that their distal end parts may protrude outward but may not escape. Further, a coil spring 16 for elastically urging the plungers 14, 14 outward is contained in the tube 12 in a contracted state. A plurality of the probes 10 having the above described structure are arranged in a socket 18 formed of insulating material. In FIG. 17, a plurality of the probes 10 are arranged in the socket 18 at a determined pitch (for example, at a pitch of 0.5 mm) rectilinearly in two rows, as seen in a plan view. The probe 10 in the related art having the above described structure is disclosed in JP-A-2006-98254.

The distal end parts of the plungers 14, 14 at both ends of the probe 10 are respectively brought into elastic contact with a measuring terminal of a device to be measured and a terminal of a test jig, whereby the measuring terminal of the device to be measured is electrically connected to the terminal of the test jig. In this manner, there is formed an electrically connected circuit in which the measuring terminal of the device to be measured is successively connected, through one of the plungers 14, the tube 12, and the other plunger 14, to the terminal of the test jig, by bringing the plunger 14, 14 into elastic contact with an inner wall of the tube 12. Moreover, there is formed another electrically connected circuit in which the one plunger 14, the coil spring 16, and the other plunger 14 are successively connected.

In recent years, the measuring terminals of the device to be measured such as an electronic circuit are arranged at an extremely small pitch of 0.5 mm, for example. Then, the probes 10 are also arranged at a small pitch of 0.5 mm or so, and an outer diameter of the tube 12 is as small as 0.3 mm, in order to keep the adjacent tubes 12, 12 insulated from each other. For this reason, the tube 12 has a thin wall thickness and a small sectional area, and its conductor resistance is larger as compared with the plungers 14, 14 having a large sectional area. Therefore, in case where a large electric current is supplied to the probe 10, remarkable heat generation and a large drop of electric voltage occur in the tube 12. As the results, there has been such inconvenience that electric current of a desired large value can not be supplied. In the related art having the above described structure, the electric current which can be supplied to the probe 10 is 1 A at most.

SUMMARY

It is therefore an object of the invention to provide a probe in which a sectional area of a tube is made larger so that a large electric current can be supplied.

In order to achieve the object, according to the invention, there is provided a contact probe comprising:

a plurality of probes, each of the probes including:

an conductive tube;

an conductive plunger, contained in at least one end side of the tube, and having a distal end part protruding outward from the tube in an axial direction of the tube; and a coil spring, contained in the tube, and adapted to elastically urge the plunger outward, wherein the plural probes are arranged in a first direction in a socket comprised of insulating material, and a cross section of the tube in a direction perpendicular to the axial direction of the tube has a greater size in a direction different from the first direction than a size in the first direction.

DETAIL DESCRIPTION OF PREFERRED EMBODIMENTS

Now, a first embodiment of the invention will be described referring to FIGS. 1A to 3. In FIGS. 1A to 3, members which are equivalent to or the same as those members as shown in FIGS. 15 to 17 will be denoted with the same reference numerals, and overlapped description will be omitted.

Figure 1A:
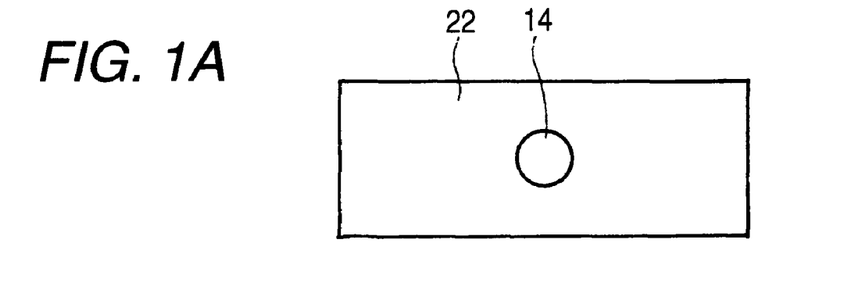
FIG. 1A is a plan view showing a probe in a first embodiment of the invention.
Figure 1B:
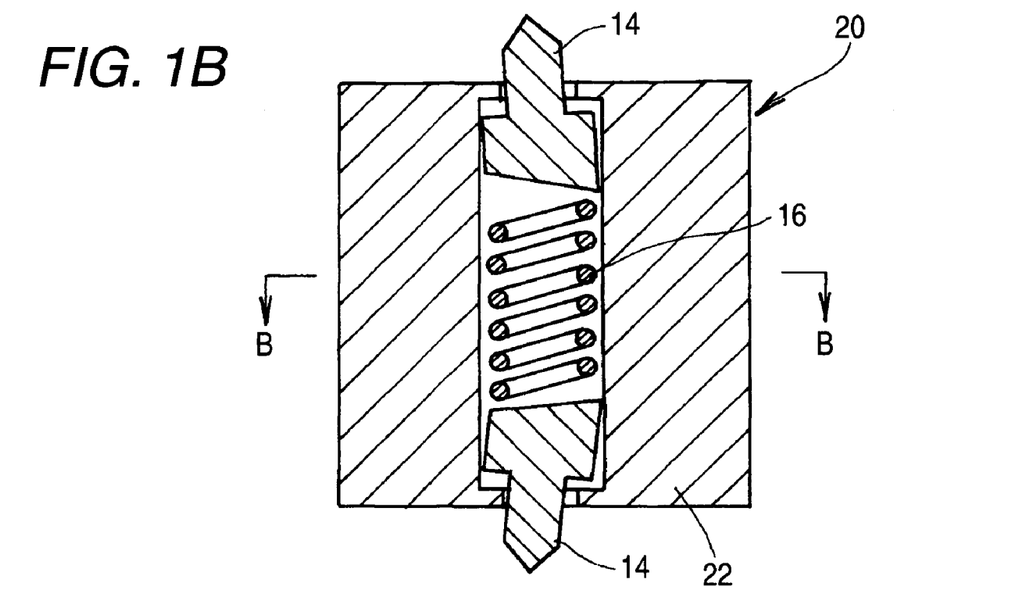
FIG. 1B is a vertical sectional view of the same.
Figure 2:
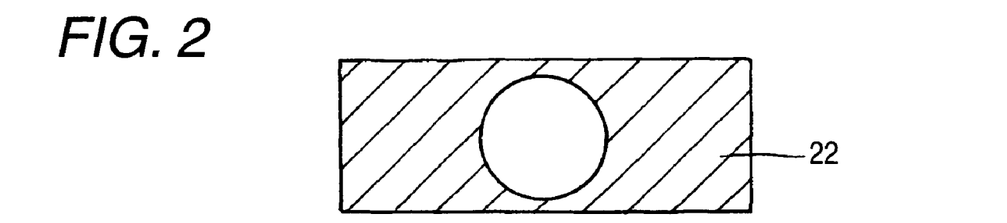
FIG. 2 is a sectional view of a tube as shown in FIG. 1B, as seen in a direction of arrow marks B-B.
Figure 3:
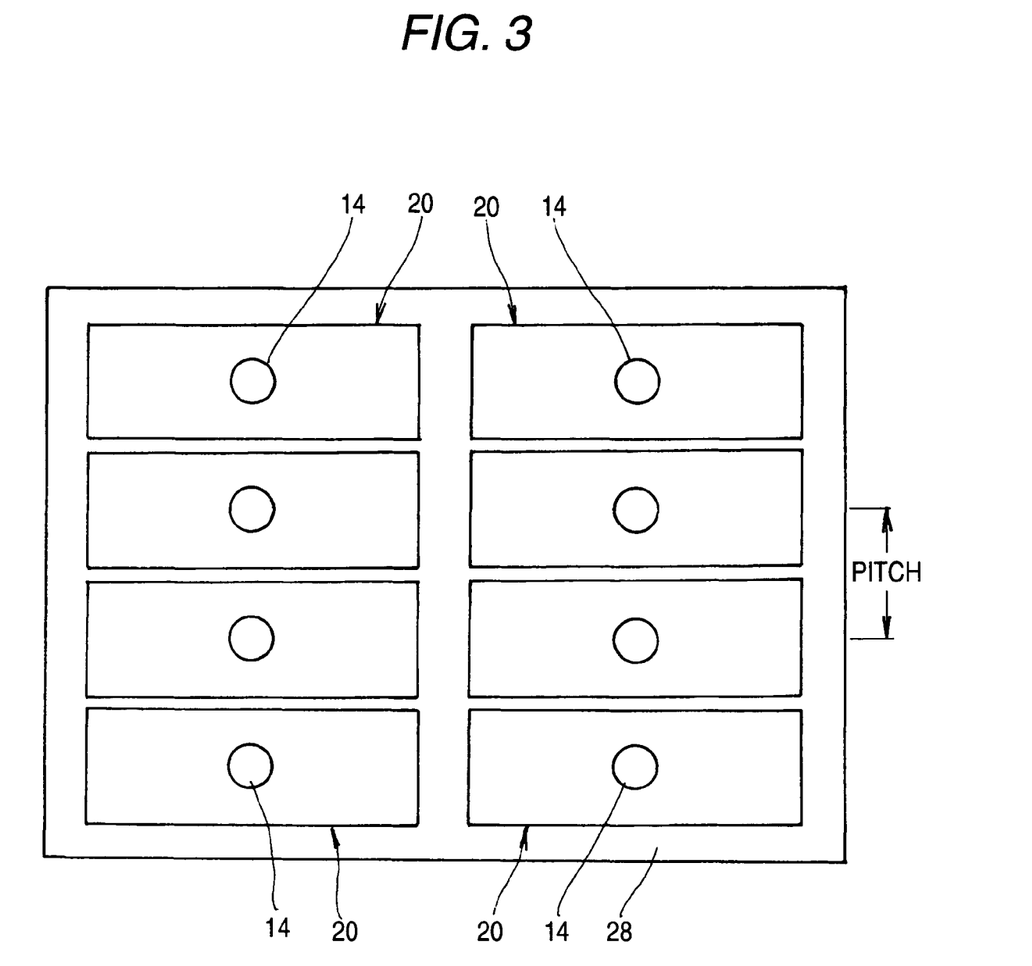
FIG. 3 is a plan view showing a plurality of the probes as shown in FIGS. 1A and 1B provided in a socket.
Figure 4A:
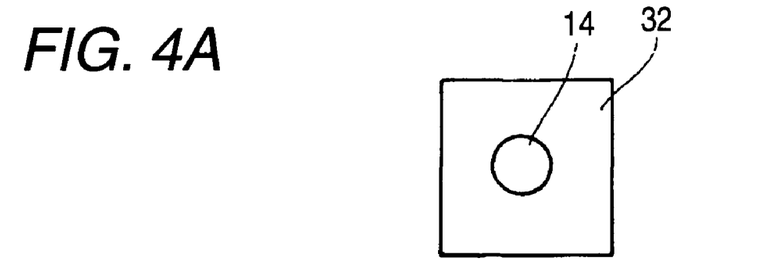
FIG. 4A is a plan view showing a probe in a second embodiment of the invention.
Figure 4B:
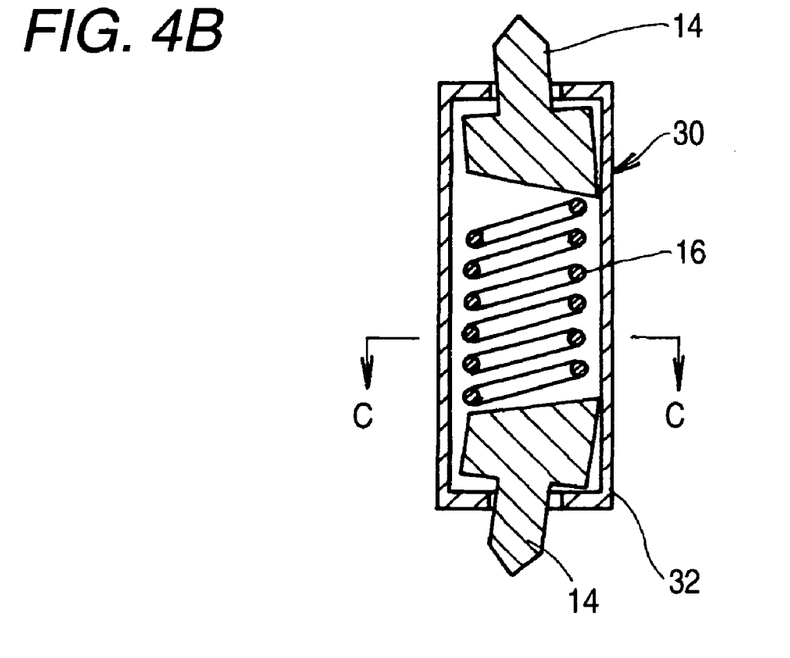
FIG. 4B is a vertical sectional view of the same.
Figure 5:
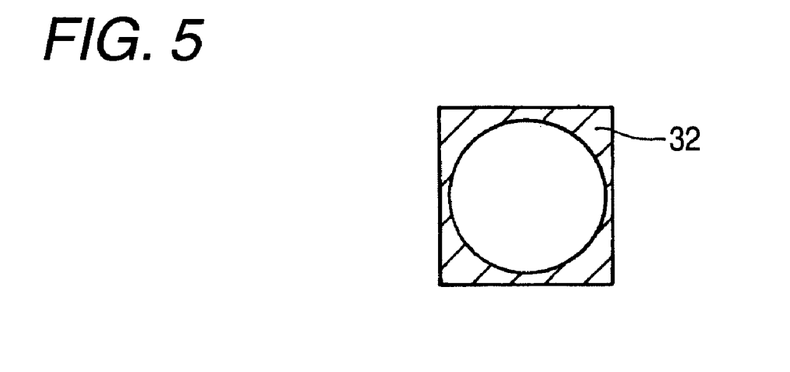
FIG. 5 is a sectional view of a tube as shown in FIG. 43, as seen in a direction of arrow marks C-C.

In the first embodiment as shown in FIGS. 1A to 3, a probe 20 includes a tube 22 having a rectangular shape in a plan view and formed of electrically conductive metal, and plungers 14, 14 formed of electrically conductive metal which are contained in a hole formed in a center part of the tube 22 so as to be protruded and contracted in an axial direction so that their distal end parts may protrude outward but may not escape. Further, a coil spring 16 for elastically urging the plungers 14, 14 outward is contained in the hole of the tube 22 in a contracted state. A plurality of the probes 20 having the above described structure are arranged in parallel with one another in a socket 28 formed of insulating material. In FIG. 3, a plurality of the probes 20 are arranged in the socket 28 at a determined pitch (at a pitch of 0.5 mm) rectilinearly in two rows in a plan view. A size of the tube 22 in a pitch direction is 0.3 mm, for example, and a size in a direction perpendicular to the pitch direction is 0.9 mm, for example. Accordingly, a sectional area of the tube 22 in the direction perpendicular to the axial direction becomes remarkably larger as compared with the related art.

As the results, conductor resistance of the tube 22 can be made small, and even though a large electric current is supplied, heat generation in the tube 22 is reduced, and voltage drop is small. Therefore, the electric current having a desired large value can be supplied. According to an experiment by the inventor, it is possible to supply the electric current of about 5 A at most to the probe 20 in the first embodiment. An outer shape of the tube 22 in the direction perpendicular to the axial direction may be appropriately set so that a size in the direction perpendicular to the pitch direction may be larger, although the size in the pitch direction is restricted by the pitch at which the probes are arranged.

Then, a second embodiment of the invention will be described referring to FIGS. 4A to 6. In FIGS. 4A to 6, members which are equivalent to or the same as those members as shown in FIGS. 1A to 3 and in FIGS. 15 to 17 will be denoted with the same reference numerals, and overlapped description will be omitted.

Figure 6:
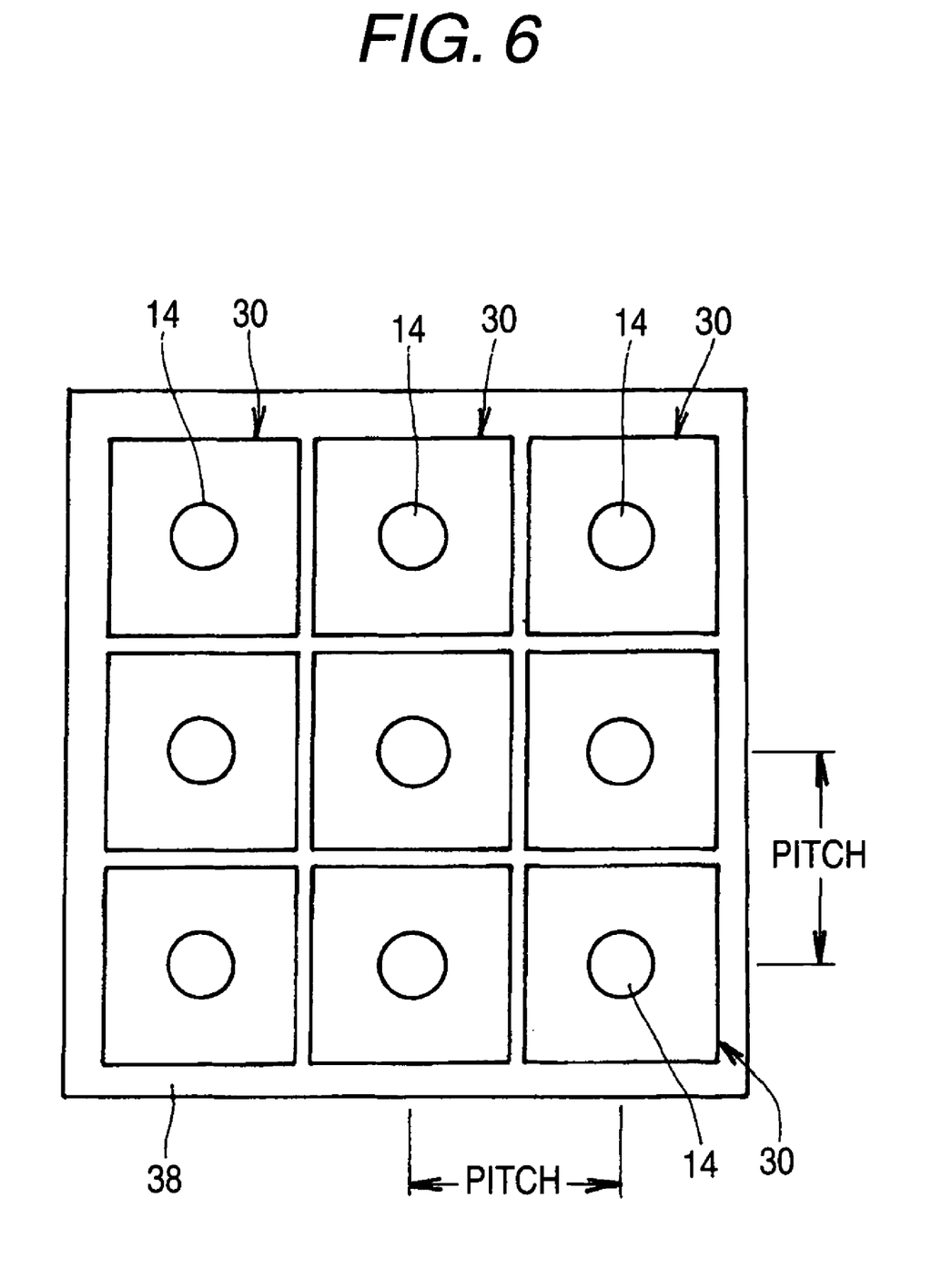
FIG. 6 is a plan view showing a plurality of the probes as shown in FIGS. 4A and 4B provided in a socket in a grid pattern.
Figure 7A:
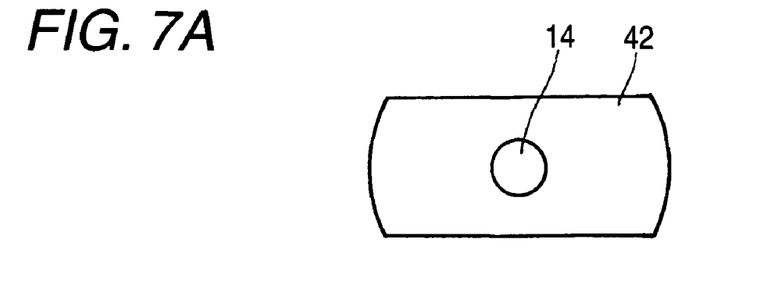
FIG. 7A is a plan view showing a probe in a third embodiment of the invention.
Figure 7B:
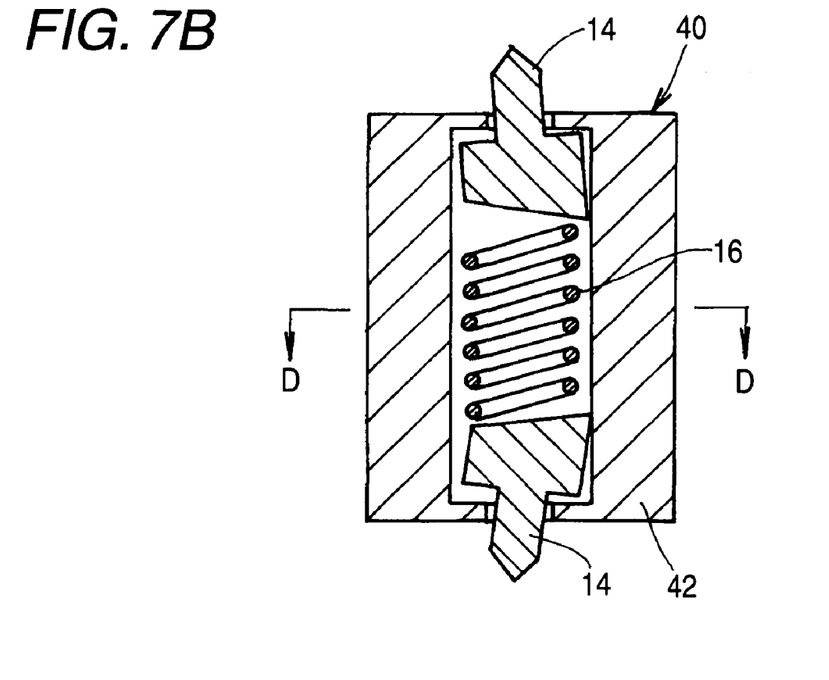
FIG. 7B is a vertical sectional view of the same.
Figure 8:
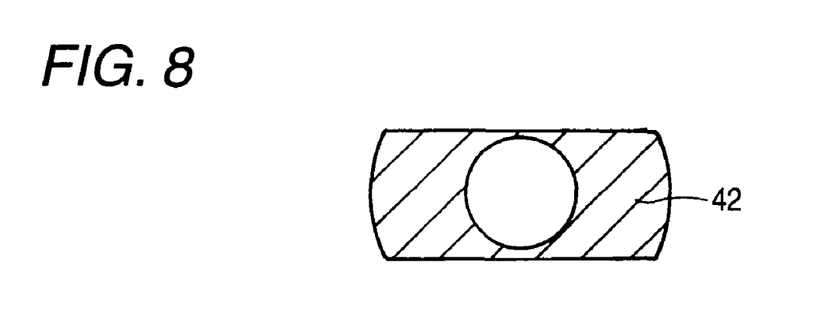
FIG. 8 is a sectional view of a tube as shown in FIG. 7B, as seen in a direction of arrow marks D-D.

In the second embodiment as shown in FIGS. 4A to 6, a probe 30 includes a tube 32 having a square shape in a plan view and formed of electrically conductive metal, and plungers 14, 14 formed of electrically conductive metal which are contained in a hole formed in a center part of the tube 32 so as to be protruded and contracted in an axial direction so that their distal end parts may protrude outward but may not escape. Further, a coil spring 16 for elastically urging the plungers 14, 14 outward is contained in the hole of the tube 32 in a contracted state. A plurality of the probes 30 having the above described structure are arranged in parallel with one another in a socket 38 formed of insulating material. In FIG. 6, a plurality of the probes 30 are arranged in the socket 38 at a determined same pitch (0.5 mm) in a grid pattern. Sizes of the tube 32 in two pitch directions intersecting each other in the grid pattern are respectively 0.3 mm, for example. Although the size in the pitch direction is the same as in the related art as shown in FIGS. 15 to 17, the size in the direction different from the pitch direction (a direction at 45 degree with respect to the pitch direction) is made larger. In this manner, by changing the round shape to a square shape, a sectional area of the tube 32 in the direction perpendicular to the axial direction is made larger as compared with the related art.

As the results, the conductor resistance of the tube 32 can be made small as compared with the example in the related art, and the conductor resistance is decreased correspondingly. Accordingly, even though a large electric current is supplied, heat generation in the tube 32 is reduced, and a voltage drop is small. Therefore, the electric current having a desired large value can be supplied.

Moreover, a third embodiment of the invention will be described referring to FIGS. 7A to 10. In FIGS. 7A to 10, members which are equivalent to or the same as those members as shown in FIGS. 1A to 6 and in FIGS. 15 to 17 will be denoted with the same reference numerals, and overlapped description will be omitted.

Figure 9:
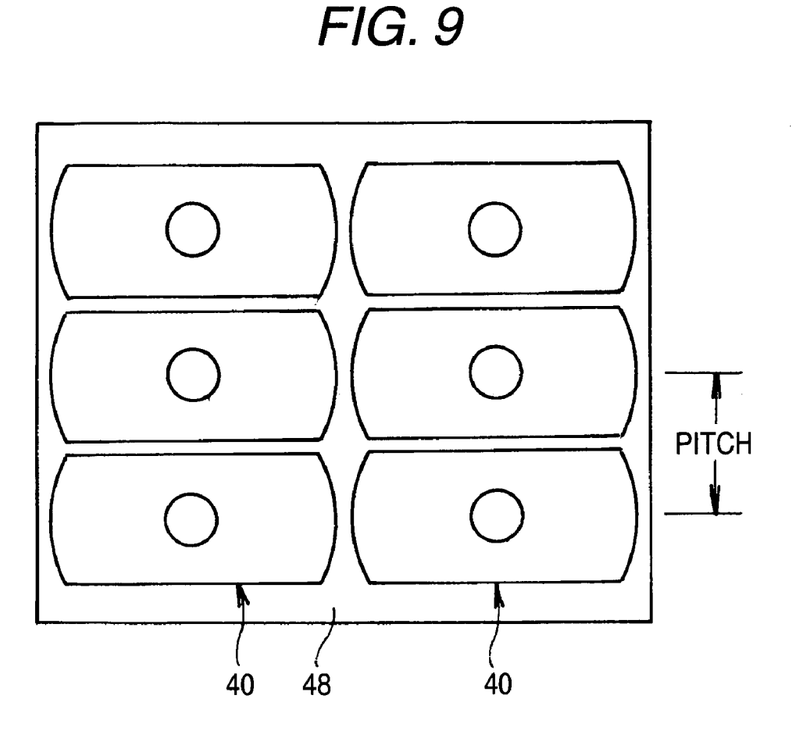
FIG. 9 is a plan view showing a plurality of the probes as shown in FIGS. 7A and 73 provided in a socket.
Figure 10:
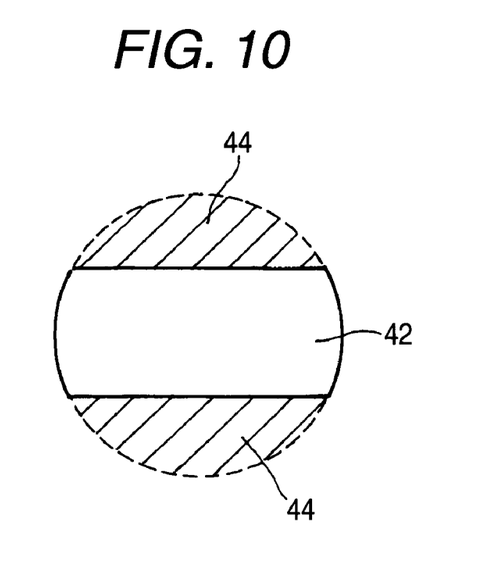
FIG. 10 is a view showing an example of forming an outer shape of the tube as shown in FIG. 8.
Figure 11A:
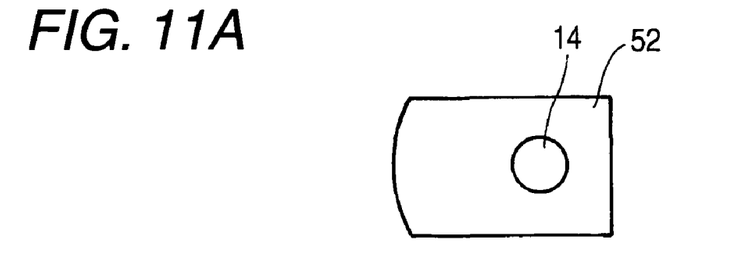
FIG. 11A is a plan view showing a probe in a fourth embodiment of the invention.
Figure 11B:
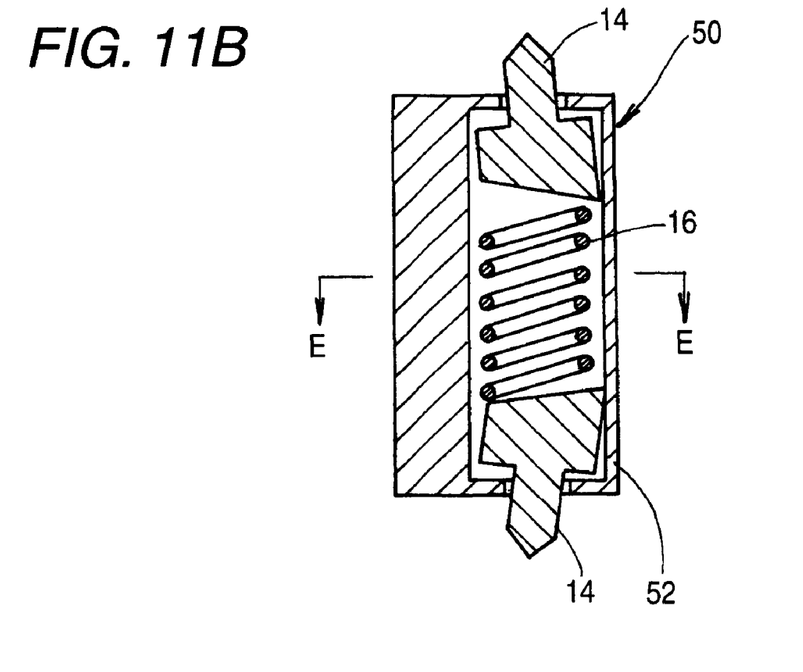
FIG. 11B is a vertical sectional view of the same.
Figure 12:
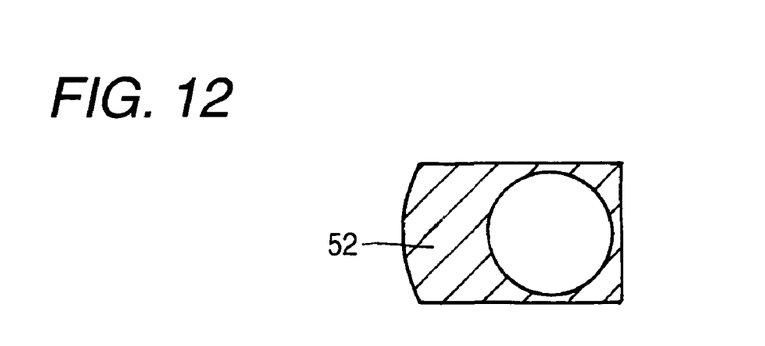
FIG. 12 is a sectional view of a tube as shown in FIG. 11B, as seen in a direction of arrow marks E-E.

In the third embodiment as shown in FIGS. 7A to 10, a probe 40 includes a tube 42 having an oval outer shape in a plan view and formed of electrically conductive metal, and plungers 14, 14 formed of electrically conductive metal which are contained in a hole formed in a center part of the tube 42 so as to be protruded and contracted in an axial direction so that their distal end parts may protrude outward but may not escape. Further, a coil spring 16 for elastically urging the plungers 14, 14 outward is contained in the hole of the tube 42 in a contracted state. A plurality of the probes 40 having the above described structure are arranged in parallel with one another in a socket 48 formed of insulating material. In FIG. 9, a plurality of the probes 40 are rectilinearly arranged in the socket 48 in a plan view, at a determined pitch (0.5 mm). A size of the tube 42 in the pitch direction is 0.3 mm, for example, but a size in a direction perpendicular to the pitch direction can be appropriately made larger. In forming an outer shape of the tube 42, a rod-like member formed of electrically conductive metal and having a round shape in cross section having a large diameter is formed with a hole for receiving the plungers 14, 14 and the coil spring 16 in a center part thereof, as a first step, and then, both sides 44, 44 of an outer peripheral part in the pitch direction are appropriately cut away by cutting works or so, as shown in FIG. 10, thereby to make the size of the tube 42 in the pitch direction smaller. Because the size of the tube 42 in the direction perpendicular to the pitch direction is made larger than the size in the pitch direction, a sectional area of the tube 42 in the direction perpendicular to the axial direction is made larger.

Further, a fourth embodiment of the invention will be described referring to FIGS. 11A to 14. In FIGS. 11A to 14, members which are equivalent to or the same as those members as shown in FIGS. 1A to 10 and in FIGS. 15 to 17 will be denoted with the same reference numerals, and overlapped description will be omitted.

Figure 13:
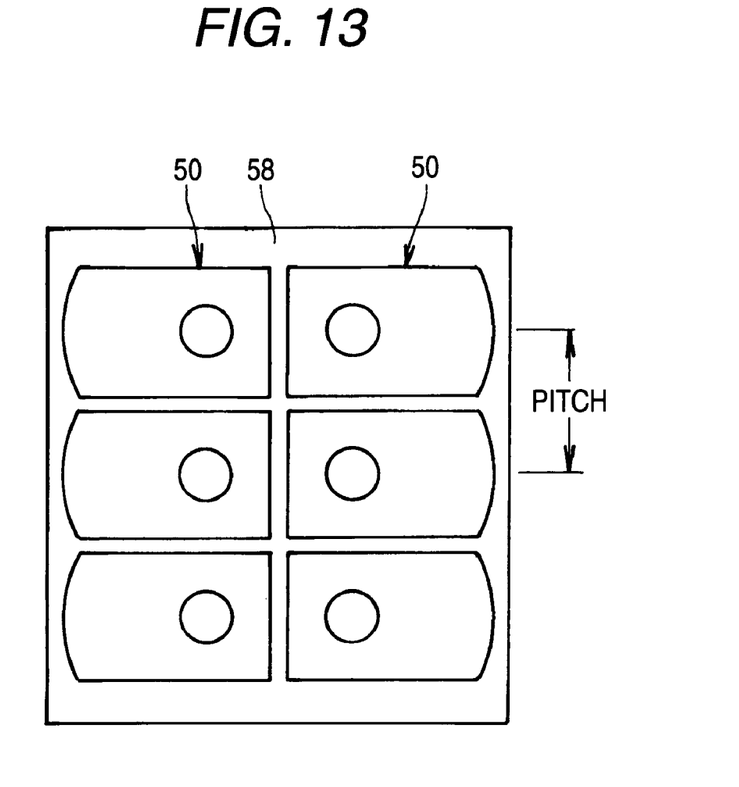
FIG. 13 is a plan view showing a plurality of the probes as shown in FIGS. 11A and 11B provided in a socket rectilinearly in two rows.
Figure 14:
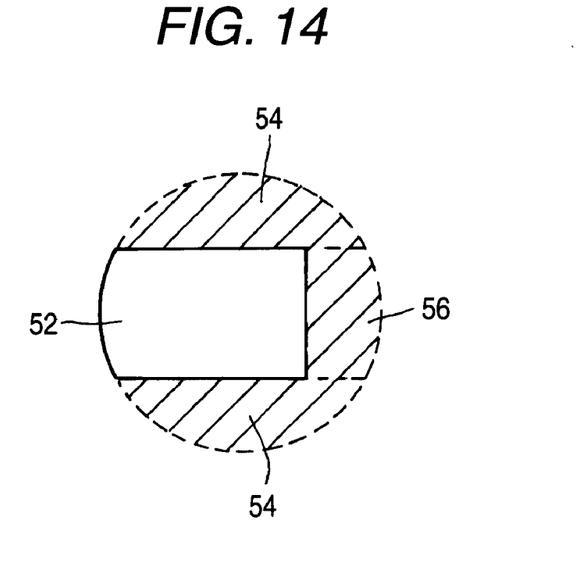
FIG. 14 is a view showing an example of forming an outer shape of the tube as shown in FIG. 12.

In the fourth embodiment as shown in FIGS. 11A to 14, a probe 50 includes a tube 52 formed of electrically conductive metal and having such an outer shape that one of shorter sides of a rectangular shape in a plan view is swelled outward in an arc-like shape. The plungers 14, 14 and the coil spring 16 are appropriately contained in a hole which is formed at a position close to the other shorter side of the tube 52. A plurality of the probes 50 having the above described structure are arranged in parallel with one another in a socket 58 formed of insulating material. In FIG. 13, a plurality of the probes 50 are rectilinearly arranged in two rows in the socket 58 in a plan view, at a determined pitch (0.5 mm). A size of the tube 52 in the pitch direction is 0.3 mm, for example, but a size in a direction perpendicular to the pitch direction can be appropriately made larger. In forming the outer shape of the tube 52, as shown in FIG. 14, a rod-like member formed of electrically conductive metal and having a round shape in cross section having a large diameter is formed with a hole for receiving the plungers 14, 14 and the coil spring 16 in a center part thereof, as a first step. Then, both side parts 54, 54 in the pitch direction are appropriately cut away by cutting works or so, and further, a part 56 inside of the rectilinear arrangement in the two rows in the direction perpendicular to the pitch direction is appropriately cut away. Because the size of the tube 52 in the direction perpendicular to the pitch direction and outside of the rectilinear arrangement in the two rows in the direction perpendicular to the pitch direction is made larger than the size in the pitch direction, a sectional area of the tube 52 in the direction perpendicular to the axial direction is made larger.

Although, in the above described embodiments, the probes 10, 20, 30, 40, 50 are provided with the plungers 14, 14 as movable terminals at both sides thereof, the plunger 14 as the movable terminal may be provided at least at one side of the probe. Moreover, in the above described embodiments, the outer shapes of the tubes 22, 32, 42, 52 may be in any shape, provided that the size in the direction different from the pitch direction is larger than the size in the pitch direction, and the sectional area in the direction perpendicular to the axial direction is made larger. Further, in the above described second embodiment, since the probes 30, 30 . . . are arranged in a grid pattern at the two same pitches, the outer shape of the tube 32 in a plan view is a square shape. However, the invention is not limited to the case, but the outer shape of the tube 32 in a plan view can be a rectangular shape, in case where the probes are arranged at the two different pitches.

In the probe according to the invention, because the outer shape of the tube in cross section in the direction perpendicular to the axial direction is so formed that the size in the direction different from the pitch direction in which a plurality of the probes are arranged is made larger, the sectional area in the direction perpendicular to the axial direction becomes larger. As the results, the conductor resistance is reduced as much as the sectional area becomes larger, and hence, heat generation in the tube and drop of the electric voltage are decreased. Therefore, it is possible to supply the electric current having a large value to a plurality of the probes which are arranged in the socket in a plan view, without varying the pitch between them.

In the probe according to the invention, the outer shape of the tube in cross section in the direction perpendicular to the axial direction is a rectangular shape which has the sides in parallel with each other in the two pitch directions intersecting in a grid pattern. As the results, the sectional area of the tube can be made larger, by changing the outer shape from the round shape in the related art to the rectangular shape. Therefore, it is possible to supply the electric current having a large value to a plurality of the probes which are arranged in the socket in the grid pattern in a plan view, without varying the pitch between them.

In the probe according to the invention, the outer shape of the tube in cross section in the direction perpendicular to the axial direction is so formed that the size of the tube in the direction perpendicular to the pitch direction is larger than the size in the pitch direction in which a plurality of the probes are arranged rectilinearly. As the results, the sectional area of the tube in the direction perpendicular to the axial direction can be made larger. Therefore, it is possible to supply the electric current having a large value to a plurality of the probes which are arranged rectilinearly in a row in the socket in a plan view, without varying the pitch between them.

In the probe according to the invention, the outer shape of the tube in cross section in the direction perpendicular to the axial direction is so formed that the size of the tube in the direction perpendicular to the pitch direction and outside of the rectilinear arrangement in the two rows is made larger than the size in the pitch direction in which a plurality of the probes are arranged rectilinearly in the two rows. As the results, the sectional area of the tube in the direction perpendicular to the axial direction can be made larger. Therefore, it is possible to supply the electric current having a large value to a plurality of the probes which are arranged rectilinearly in the two rows in the socket in a plan view, without varying the pitch between them.

What is claimed is:

1. A contact probe comprising: a plurality of probes, each of the probes including:
   a conductive tube, having a peripheral wall extending in an axial direction of the tube, the peripheral wall defining a hole inside thereof;
   a conductive plunger, contained in at least one end side of the hole, and having a distal end part protruding outward from the hole in the axial direction of the tube; and
   a coil spring, contained in the hole, and adapted to elastically urge the plunger outward,
   wherein a cross section of the peripheral wall of the tube on a plane perpendicular to the axial direction of the tube has a first width in a first direction in which the plurality of probes are arranged in a socket comprising of insulating material and a second width in a second direction different from the first direction, and the second width is greater than the first width.

2. A probe comprising:
   a container, including a first surface, a second surface opposed to the first surface, and a third surface connecting the first surface and the second surface, and
   a plunger which is contained in the container and a part of which protrudes outward from at least one of the first surface and the second surface, wherein a thickness of the third surface is not uniform in a section thereof.

* * * * *